(12) United States Patent
Kakizaki et al.

(10) Patent No.: US 7,008,860 B2
(45) Date of Patent: Mar. 7, 2006

(54) SUBSTRATE MANUFACTURING METHOD

(75) Inventors: Yasuo Kakizaki, Kanagawa (JP); Masataka Ito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/778,248

(22) Filed: Feb. 17, 2004

(65) Prior Publication Data

US 2004/0185638 A1    Sep. 23, 2004

(30) Foreign Application Priority Data

Feb. 14, 2003   (JP) ............................. 2003-037404

(51) Int. Cl.
*H01L 21/30*   (2006.01)
(52) U.S. Cl. ...................... 438/459; 438/480
(58) Field of Classification Search ................ 438/745, 438/750, 67, 107–108, 118–119, 149, 473, 438/514, 723, 756, 924, 928, 967, 974, 976, 438/977, 981, 150–151, 301, 303, 306–307, 438/403–406, 455, 458–459, 479, 527, 530, 438/532, 692, 694, 697, 743; 257/53, 72; 349/110, 122, 138

See application file for complete search history.

(56) References Cited

U.S. PATENT DOCUMENTS

| 5,374,564 | A |  | 12/1994 | Bruel ............................ 437/24 |
| 5,909,626 | A | * | 6/1999 | Kobayashi ................... 438/406 |
| 5,994,207 | A |  | 11/1999 | Henley et al. ............... 438/515 |
| 6,251,754 | B1 |  | 6/2001 | Ohshima et al. ............ 438/506 |
| 6,368,947 | B1 | * | 4/2002 | Yu .............................. 438/530 |
| 6,503,811 | B1 | * | 1/2003 | Ohkubo ....................... 438/406 |
| 6,556,264 | B1 | * | 4/2003 | Hirakata et al. ............. 349/110 |
| 6,613,676 | B1 | * | 9/2003 | Yonehara et al. ............ 438/691 |
| 6,661,025 | B1 | * | 12/2003 | Hirabayashi .................. 257/53 |

FOREIGN PATENT DOCUMENTS

| EP | 1 039 513 A2 | 9/2000 |
| EP | 1 187 216 A1 | 3/2002 |
| JP | 5-211128 | 8/1993 |

* cited by examiner

*Primary Examiner*—Michael Lebentritt
*Assistant Examiner*—Andre' Stevenson
(74) *Attorney, Agent, or Firm*—Fitzpatrick, Cella, Harper & Scinto

(57) ABSTRACT

This invention provides a method of manufacturing a substrate having a thin buried insulating film. An insulating layer (12) is formed on a single-crystal Si substrate (11). Ions are implanted into the substrate (11) through the insulating layer (12) to form an ion-implanted layer (13). The insulating layer (12) is thinned down to form a thin insulating layer (12a). A thus prepared first substrate is placed on a second substrate (20) to form a bonded substrate stack (30). After that, the bonded substrate stack (30) is split at the ion-implanted layer (13).

8 Claims, 2 Drawing Sheets

SUBSTRATE MANUFACTURING METHOD

FIELD OF THE INVENTION

The present invention relates to a substrate manufacturing method and, more particularly, to a method of manufacturing a substrate having a buried insulating layer.

BACKGROUND OF THE INVENTION

A substrate having a semiconductor layer on an insulating layer is known as an SOI (Silicon On Insulator or Semiconductor On Insulator) substrate. A method of manufacturing an SOI substrate is disclosed in Japanese Patent Laid-Open No. 5-211128. In the method disclosed in this reference, to separate a semiconductor substrate into a lower portion and a thin upper portion, ions are implanted into the semiconductor substrate. Next, the semiconductor substrate is bonded to a stiffener. The assembly of the semiconductor substrate and stiffener is annealed to rearrange the crystal and coagulate bubbles in the ion-implanted layer, thereby separating the lower portion from the thin upper portion. With this method, the thin upper portion of the semiconductor substrate is transferred to the stiffener.

The reference discloses that a semiconductor substrate having an encapsulating layer made of, e.g., silicon oxide is employed as a semiconductor substrate in which ions should be implanted, and the encapsulating layer may be either removed or left after ion implantation. However, the reference neither discloses nor suggests any technique for thinning down the silicon oxide encapsulating layer after ion implantation.

The present inventors are focusing attention on an SOI substrate manufacturing method. In this method, an insulating layer is formed on the surface of a semiconductor substrate. After that, ions are implanted into the semiconductor substrate through the insulating layer to form an ion-implanted layer. The semiconductor substrate is bonded to another substrate to prepare a bonded substrate stack. Then, the bonded substrate stack is split at the ion-implanted layer.

In this method, however, the thicknesses of the SOI layer and the underlying buried oxide film (BOX layer) in the resultant SOI substrate are controlled by the depth of ion implantation in the semiconductor substrate. When a thin BOX layer should be obtained, the SOI layer becomes thick. Conversely, when a thin SOI layer should be obtained, the BOX layer becomes thick. To make both the SOI layer and the BOX layer thin, the ion implantation energy must be low. In this method, however, it is difficult to accurately control formation of the ion-implanted layer or stably form the ion-implanted layer.

SUMMARY OF THE INVENTION

The present invention has been made on the basis of recognition of the above problems, and has as its object to provide, e.g., a method of manufacturing a substrate having a thin buried insulating film.

A manufacturing method of the present invention is a method of manufacturing a substrate having a buried insulating layer. This method comprises an insulating layer formation step of forming an insulating layer on a semiconductor region of a first substrate including the semiconductor region, an implantation step of implanting ions to the semiconductor region through the insulating layer to form an ion-implanted layer, an insulating layer thinning step of thinning down the insulating layer after the implantation step, a bonding step of bonding a second substrate to the first substrate via the insulating layer to prepare a bonded substrate stack, and a splitting step of splitting the bonded substrate stack by using the ion-implanted layer to obtain a substrate which has the insulating layer on the second substrate and a semiconductor layer as part of the semiconductor region on the insulating layer.

According to a preferred aspect of the present invention, the insulating layer thinning step can include a step of etching the insulating layer or a step of polishing the insulating layer.

According to the preferred aspect of the present invention, the manufacturing method of the present invention preferably further comprises a removal step of removing the ion-implanted layer that remains on a surface of the second substrate after splitting. The removal step can include a step of etching the surface of the second substrate after splitting or a step (e.g., a CMP step) of polishing the surface of the second substrate after splitting.

According to the preferred aspect of the present invention, the manufacturing method of the present invention preferably further comprises a semiconductor layer thinning step of thinning down the semiconductor layer on the second substrate after splitting. The semiconductor layer thinning step can include a step of etching the semiconductor layer or a step (e.g., a CMP step) of polishing the semiconductor layer.

According to the preferred aspect of the present invention, in the insulating layer formation step, the insulating layer is preferably formed on the first substrate having an epitaxial layer on a surface. The epitaxial layer preferably has a thickness not less than twice a thickness of the semiconductor region consumed in the insulating layer formation step and subsequent steps.

According to the preferred aspect of the present invention, the manufacturing method of the present invention preferably further comprises a reproduction step of making the first substrate after splitting usable as one of the first substrate to be ion-implanted in the implantation step and the second substrate. The reproduction step can include a step of removing the ion-implanted layer that remains on a surface of the first substrate after splitting or a step of planarizing a surface of the first substrate after splitting.

According to the preferred aspect of the present invention, the manufacturing method of the present invention preferably further comprises a growth step of growing an epitaxial layer on the substrate reproduced in the reproduction step. In this case, in the insulating layer formation step, the insulating layer is formed on the epitaxial layer on the substrate reproduced in the reproduction step. In the growth step, an epitaxial layer having a thickness not less than twice a thickness of the semiconductor region lost in the insulating layer formation step and subsequent steps is preferably formed. In addition, the growth step is preferably executed every time a manufacturing step corresponding to one cycle from the insulating layer formation layer to the reproduction step is executed a plurality of number of times.

According to the preferred aspect of the present invention, the semiconductor region is preferably a single-crystal silicon region. In the insulating layer formation step, the insulating layer can be formed by thermally oxidizing a surface of the single-crystal silicon region.

According to another aspect of the present invention, there is provided a method of manufacturing a substrate having a buried insulating layer. This manufacturing method comprises a first step of preparing a first substrate which has a semiconductor layer on a separation layer and an insulating layer on the semiconductor layer, a second step of bonding the first substrate to a second substrate via the insulating layer to prepare a bonded substrate stack, a third step of splitting the bonded substrate stack at the separation layer, and a fourth step of processing a surface on a side of the first substrate after splitting, growing an epitaxial layer on the surface, and reusing a resultant substrate as a material in the first step.

According to the preferred aspect of the present invention, in the fourth step, an epitaxial layer having a thickness not less than twice a thickness of the semiconductor layer consumed in the first step and subsequent steps is preferably formed. The fourth step is preferably executed every time a manufacturing step corresponding to one cycle including the first step to the third step is executed a plurality of number of times.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described below with reference to the accompanying drawings.

[First Embodiment]

Figure 1:
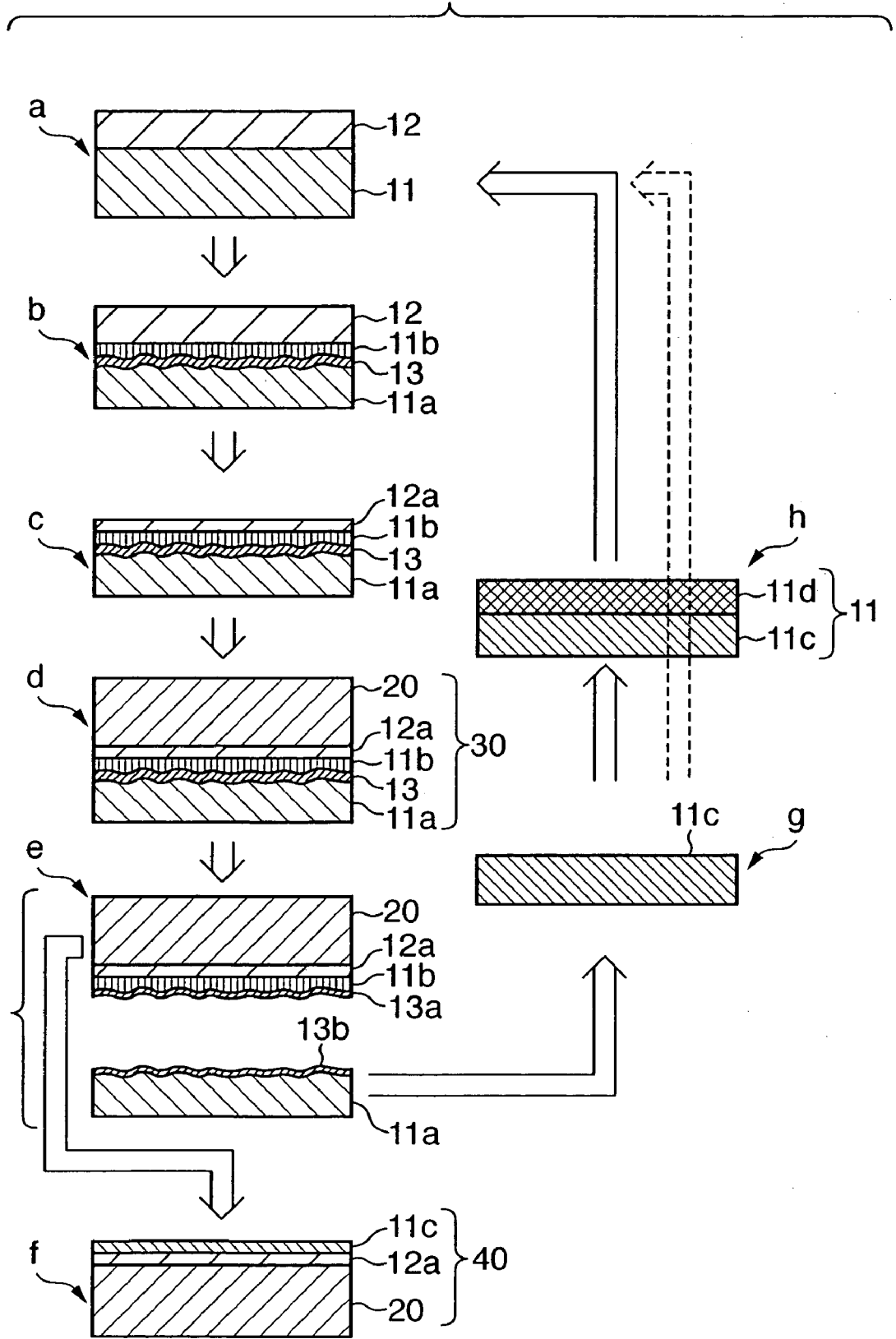
FIG. 1 is a schematic view showing steps in a substrate manufacturing method according to the first embodiment of the present invention.

FIG. 1 is a schematic view showing steps in a substrate manufacturing method according to the first embodiment of the present invention. In the step shown as "a" in FIG. 1, a first single-crystal Si substrate (seed substrate) 11 is prepared. An insulating layer (silicon oxide film) 12 having a thickness Tox is formed on the surface of the first substrate by thermal oxidation. As the first substrate 11, a single-crystal Si substrate having an epitaxial layer on its surface may be prepared.

In the step shown as "b" in FIG. 1, at least one element selected from a rare gas, hydrogen, and nitrogen is ion-planted into the first substrate shown as "a" in FIG. 1 from its major surface (the surface on which the insulating layer 12 is formed) to form an ion-implanted layer 13 in the first substrate. Referring to "b" in FIG. 1, of the substrate 11, a portion on the upper side of the ion-implanted layer 13 is a single-crystal Si layer 11b. A portion on the lower side of the ion-implanted layer 13 is a single-crystal Si substrate 11a. The ion-implanted layer 13 functions as a separation layer that splits the bonded substrate stack into two substrates later in the splitting step ("e" in FIG. 1).

In the step shown as "c" in FIG. 1, the insulating layer 12 as the uppermost layer on the first substrate shown as "b" in FIG. 1 is thinned down to form an insulating layer 12a having a thickness $T_{Box}$. As the method of thinning down the insulating layer 12, for example, etching such as dry etching or wet etching or polishing such as CMP (Chemical Mechanical Polishing) is preferably used. However, any other method may be applied.

In the step shown as "d" in FIG. 1, a second substrate (handle wafer) 20 is bonded to the major surface side (i.e., the side of the insulating layer 12) of the first substrate shown as "c" in FIG. 1 at room temperature to prepare a bonded substrate stack 30. As the second substrate 20, for example, a silicon substrate, a substrate prepared by forming a silicon oxide film on a silicon substrate, a transparent substrate made of, e.g., quartz, or a sapphire substrate is preferably used. However, any other substrate may be employed. The surface of the second substrate 20 is preferably sufficiently flat.

In the step shown as "e" in FIG. 1, the bonded substrate stack 30 is split into two parts at the ion-implanted layer 13. To split the bonded substrate stack, preferably, an external force is applied to the bonded substrate stack by, e.g., applying a pressure to the bonded substrate stack, pulling part of the bonded substrate stack, applying a shearing force to the bonded substrate stack, or inserting a wedge to the ion-implanted layer 13 of the bonded substrate stack. Alternatively, preferably, the bonded substrate stack is heated, thermal stress is generated in the bonded substrate stack, or the bonded substrate stack is softened. However, any other method may be employed.

With this splitting, parts 13b and 13a of the ion-implanted layer 13 remain on the first substrate side and second substrate side, respectively.

In the step shown as "f" in FIG. 1, the surface of the second substrate after splitting is planarized. This planarization preferably includes a polishing step such as CMP and a subsequent annealing step in a reduction atmosphere containing hydrogen. When a polishing step such as CMP is executed in the planarization, a single-crystal Si layer 11c as an SOI layer can be thinned down so a thinner SOI layer can be obtained. With the above steps, an SOI substrate 40 schematically shown as "f" in FIG. 1 can be obtained.

The SOI substrate 40 has, as a buried silicon oxide film (BOX), the insulating layer 12a having the thickness $T_{Box}$ smaller than the thickness Tox of the insulating layer 12 formed in the step shown as "a" in FIG. 1. More specifically, after the insulating layer 12 having a thickness suitable for ion implantation is formed on the surface of the first substrate 11, ions are implanted into the first substrate 11 through the insulating layer 12, and then, the insulating layer 12 is thinned down. With this method, the thickness of the insulating layer 12a as a buried silicon oxide film can freely be controlled. In addition, after splitting the bonded substrate stack 30, the remaining ion-implanted layer 13a is removed, and the single-crystal Si layer 11b under it is thinned down. With this method, the thickness of the single-crystal Si layer 11c as a final SOI layer can freely be controlled. The flatness of the buried insulating layer 12a depends on the step of thinning down or planarizing the insulating layer 12 before the first substrate is bonded to the second substrate. The flatness of the SOI layer 11c depends on the step of thinning down or planarizing the SOI layer 11.

For the first substrate 11a after splitting, in the step shown as "g" in FIG. 1, the ion-implanted layer 13b remaining on the surface is removed. If the surface is so rough that the flatness is impermissible, surface planarization is executed. With this process, the substrate can be reused as the first Si single-crystal substrate 11 or the second substrate 20.

If the first substrate 11a after splitting should be reused as the first single-crystal Si substrate 11, the remaining ion-implanted layer 13b is removed to planarize the surface, as needed, in the step shown as "g" in FIG. 1. Then, in the step shown as "h" in FIG. 1, a single-crystal Si epitaxial layer 11d may be formed on the surface of the substrate 11c. With this process, the thickness that is lost in the steps shown as "a" to "g" in FIG. 1 can be recovered. Hence, the substrate 11 can be reused semipermanently.

As the first substrate, not only a single-crystal Si substrate but also various kinds of semiconductor substrates such as a polysilicon substrate or a substrate having a compound semiconductor layer can be employed.

[Second Embodiment]

Figure 2:
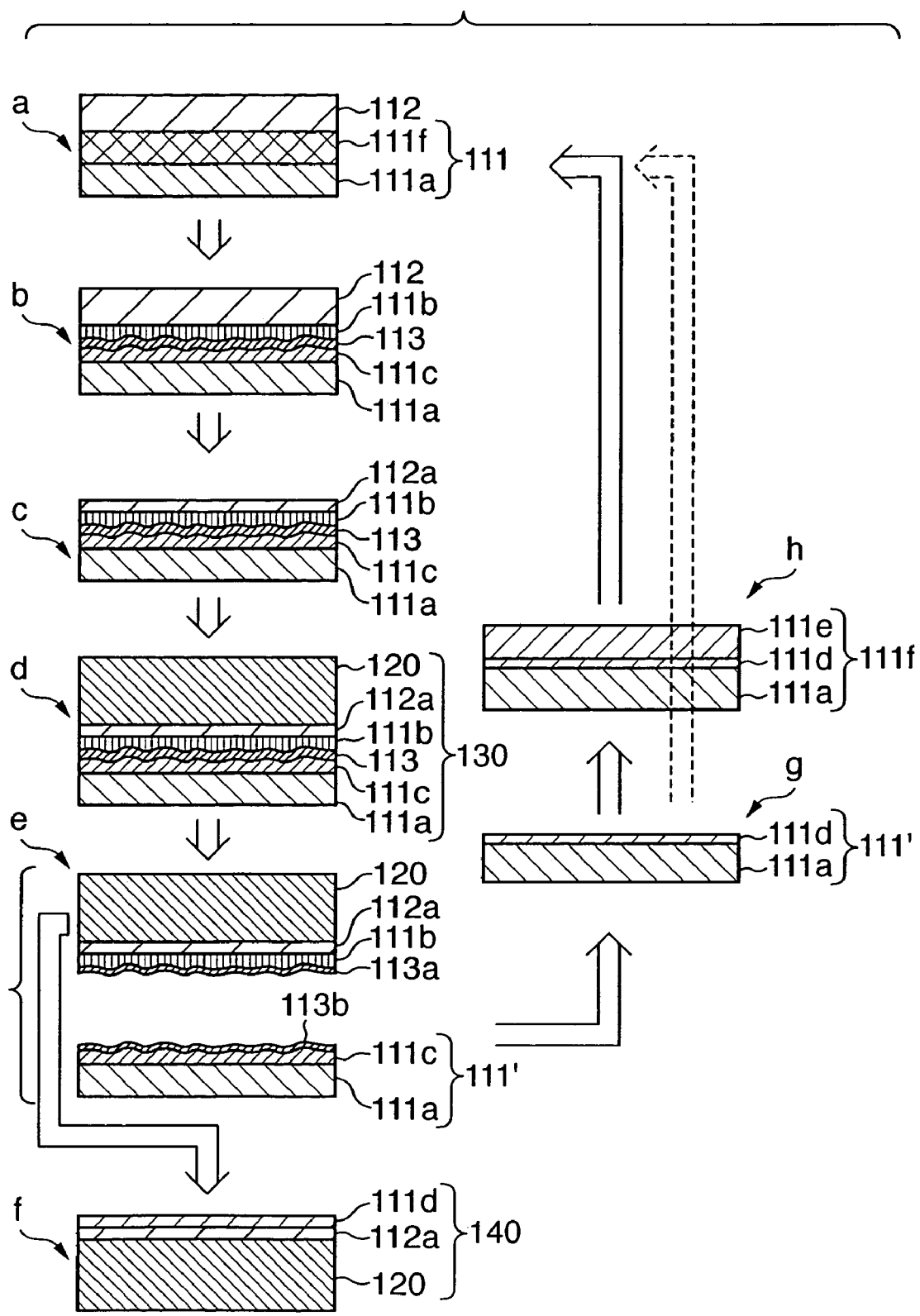
FIG. 2 is a schematic view showing steps in a substrate manufacturing method according to the second embodiment of the present invention.

FIG. 2 is a schematic view showing steps in a substrate manufacturing method according to the second embodiment of the present invention. In this embodiment, a single-crystal Si substrate having a single-crystal Si layer epitaxially formed on the surface is used as the first substrate on which an insulating layer is to be formed.

In the step shown as "a" in FIG. 2, a single-crystal Si substrate 111 having a single-crystal Si layer 111f epitaxially formed on the surface is prepared as the first substrate (seed substrate) 111. An insulating layer (silicon oxide film) 112 having a thickness Tox is formed on the surface of the first substrate 111 by thermal oxidation.

In the step shown as "b" in FIG. 2, at least one element selected from a rare gas, hydrogen, and nitrogen is ion-planted into the first substrate shown as "a" in FIG. 2 from its major surface (the surface on which the insulating layer 112 is formed) to form an ion-implanted layer 113 in the first substrate. Referring to "b" in FIG. 2, of the epitaxial growth layer 111f, a portion on the upper side of the ion-implanted layer 113 is a single-crystal Si layer 111b. A portion on the lower side of the ion-implanted layer 113 is a single-crystal Si substrate 111c. The ion-implanted layer 113 may be formed in a substrate 111a.

In the step shown as "c" in FIG. 2, the insulating layer 112 as the uppermost layer on the first substrate shown as "b" in FIG. 2 is thinned down to form an insulating layer 112a having a thickness $T_{Box}$. As the method of thinning down the insulating layer 112, for example, etching such as dry etching or wet etching or polishing such as CMP (Chemical Mechanical Polishing) is preferably used. However, any other method may be applied.

In the step shown as "d" in FIG. 2, a second substrate (handle wafer) 120 is bonded to the major surface side (i.e., the side of the insulating layer 112) of the first substrate shown as "c" in FIG. 2 at room temperature to prepare a bonded substrate stack 130. As the second substrate 120, for example, a silicon substrate, a substrate prepared by forming a silicon oxide film on a silicon substrate, a transparent substrate made of, e.g., quartz, or a sapphire substrate is preferably used. However, any other substrate may be employed. The surface of the second substrate 120 is preferably sufficiently flat.

In the step shown as "e" in FIG. 2, the bonded substrate stack 130 is split into two parts at the ion-implanted layer 113. To split the bonded substrate stack, preferably, an external force is applied to the bonded substrate stack by, e.g., applying a pressure to the bonded substrate stack, pulling part of the bonded substrate stack, applying a shearing force to the bonded substrate stack, or inserting a wedge to the ion-implanted layer 113 of the bonded substrate stack. Alternatively, preferably, the bonded substrate stack is heated, thermal stress is generated in the bonded substrate stack, or the bonded substrate stack is softened. However, any other method may be employed.

With this splitting, parts 113b and 113a of the ion-implanted layer 113 remain on the first substrate side and second substrate side, respectively.

In the step shown as "f" in FIG. 2, the surface of the second substrate after splitting is planarized. This planarization preferably includes a polishing step such as a CMP step and a subsequent annealing step in a reduction atmosphere containing hydrogen. When a polishing step such as a CMP step is executed in the planarization, a single-crystal Si layer 111d as an SOI layer can be thinned down so a thinner SOI layer can be obtained. With the above steps, an SOI substrate 140 schematically shown as "f" in FIG. 2 can be obtained.

The SOI substrate 140 has, as a buried silicon oxide film (BOX), the insulating layer 112a having the thickness $T_{Box}$ smaller than the thickness Tox of the insulating layer 112 formed in the step shown as "a" in FIG. 2. More specifically, after the insulating layer 112 having a thickness suitable for ion implantation is formed on the surface of the first substrate 111, ions are implanted into the first substrate 111 through the insulating layer 112, and then, the insulating layer 112 is thinned down. With this method, the thickness of the insulating layer 112a as a buried silicon oxide film can freely be controlled. In addition, after splitting the bonded substrate stack 130, the remaining ion-implanted layer 113a is removed, and the single-crystal Si layer 111b under it is thinned down. With this method, the thickness of the single-crystal Si layer 111d as a final SOI layer can freely be controlled. The flatness of the buried insulating layer 112a depends on the step of thinning down or planarizing the insulating layer 112 before the first substrate is bonded to the second substrate. The flatness of the SOI layer 111d depends on the step of thinning down or planarizing the SOI layer 111b.

For a first substrate 111' after splitting, the remaining ion-implanted layer 113b is removed to planarize the surface, as needed, in the step shown as "g" in FIG. 2. Then, in the step shown as "h" in FIG. 2, a single-crystal Si epitaxial layer 111e is formed on the surface of the substrate 111'. With this process, the thickness that is lost in the steps shown as "a" to "g" in FIG. 2 can be recovered. Hence, the substrate 111 can be reused semipermanently. Let $T_{cycle}$ be the thickness of the Si single crystal consumed in one cycle of the steps shown as "a" to "g" in FIG. 2. In the step shown as "h" in FIG. 2, the thickness of the epitaxial layer 111e is preferably at least $T_{cycle}$ or more and, more preferably, $T_{cycle} \times 2$ or more. When the epitaxial layer 111e having a thickness of $T_{cycle} \times 2$ or more is formed, the frequency of execution of the step shown as "h" in FIG. 2 can be reduced. For example, to form the epitaxial layer 111e having a thickness between $T_{cycle} \times 2$ (inclusive) and $T_{cycle} \times 3$ (exclusive), the step shown as "h" in FIG. 2 is executed for every two cycles of the steps shown as "a" to "g" in FIG. 2.

The above-described recycle method can also be applied to a method of forming a porous layer by, e.g., anodizing in place of an ion-implanted layer. In an SOI substrate manufacturing method including a step of forming a porous layer by anodizing, for example, a porous layer (separation layer) is formed on the surface of a seed substrate by anodizing. A semiconductor layer such as a single-crystal Si layer is formed on the porous layer. An insulating layer is formed on the semiconductor layer to prepare a first substrate. The first substrate is bonded to a second substrate (handle wafer) to form a bonded substrate stack. The bonded substrate stack is split at the porous layer. When the step shown as "g" in FIG. 2 or the steps shown as "g" and "h" in FIG. 2 are applied to the first substrate side after splitting, the substrate processed in these steps can be reused as a seed substrate.

As the first substrate, not only a single-crystal Si substrate but also various kinds of semiconductor substrates such as a polysilicon substrate or a substrate having a compound semiconductor layer can be employed.

Examples as detailed application examples of the present invention will be described below.

EXAMPLE 1

A 700-nm thick $SiO_2$ film (insulating layer) 12 was formed on a first single-crystal Si substrate (seed substrate) 11 by thermal oxidation ("a" of FIG. 1). $H^+$ ions were implanted through the $SiO_2$ film 12 on the surface of the first substrate at 100 KeV and $5 \times 10^{16}$ $cm^{-2}$ to form an ion-implanted layer 13 ("b" of FIG. 1). The 700-nm thick $SiO_2$ film 12 on the first substrate was etched by 690 nm by using a hydrofluoric acid solution to convert the $SiO_2$ film 12 into a 10-nm thick $SiO_2$ film 12a ("c" of FIG. 1). The surface of the $SiO_2$ layer 12a was placed on the surface of a separately prepared Si substrate (second substrate (handle wafer)) 20 to form a bonded substrate stack 30 ("d" of FIG. 1).

The bonded substrate stack 30 was annealed at 600° C. The bonded substrate stack 30 was split into two parts near the projection range of ion implantation (ion-implanted layer 13). An SOI substrate having, on the second substrate 20, the 10-nm thick $SiO_2$ film 12a and a 150-nm thick single-crystal film 11b having a rough surface and formed on the $SiO_2$ film 12a was obtained ("e" of FIG. 1). To increase the bonding strength of the SOI substrate, annealing was executed at 1,000° C. for 4 hrs. To planarize the surface of the SOI layer 11b of the SOI substrate and obtain the SOI layer 11b having a desired thickness, the surface of the SOI layer 11b was ground and polished by 50 nm by CMP ("f" of FIG. 1).

With the above steps, an SOI substrate 40 having the 10-nm thick oxide film 12a on the Si substrate 20 and a 100-nm thick single-crystal Si layer (SOI layer) 11c on the oxide film 12a was obtained. When the thickness of the resultant SOI substrate 40 was measured at 100 points in the entire plane, the film thickness uniformity of the SOI layer 11c was 100 nm± 3 nm. The oxide film (BOX; buried oxide film) 12a had a uniform thickness of 10 nm±1 nm.

EXAMPLE 2

A 200-nm thick $SiO_2$ film (insulating layer) 12 was formed on a first single-crystal Si substrate (seed substrate) 11 by thermal oxidation ("a" of FIG. 1). $H^+$ ions were implanted through the $SiO_2$ film 12 on the surface of the first substrate at 30 KeV and $1 \times 10^{17}$ $cm^{-2}$ to form an ion-implanted layer 13 ("b" of FIG. 1). The 200-nm thick $SiO_2$ film 12 on the first substrate was etched by 180 nm by using a hydrofluoric acid solution to convert the $SiO_2$ film 12 into a 20-nm thick $SiO_2$ film 12a ("c" of FIG. 1). The surface of the $SiO_2$ layer 12a was placed on the surface of the separately prepared Si substrate (second substrate (handle wafer)) 20 to form a bonded substrate stack 30 ("d" of FIG. 1).

The bonded substrate stack 30 was annealed at 500° C. The bonded substrate stack 30 was split into two parts near the projection range of ion implantation (ion-implanted layer 13). An SOI substrate having, on the second substrate 20, the 20-nm thick $SiO_2$ film 12a and a 200-nm thick single-crystal film 11b having a rough surface and formed on the $SiO_2$ film 12a was obtained ("e" of FIG. 1). To increase the bonding strength of the SOI substrate, annealing was executed at 800° C. for 3 hrs. To planarize the surface of the SOI layer 11b of the SOI substrate, annealing was executed in a hydrogen atmosphere at 1,100° C. for 3 hrs ("f" of FIG. 1). The surface roughness of the SOI layer 11b was evaluated by using an atomic force microscope. The mean square roughness in a region with a size of 50 μm square was about 0.2 nm, which was the same as that of a normally commercially available Si wafer.

With the above steps, an SOI substrate 40 having the 20-nm thick oxide film 12a on the Si substrate 20 and a 200-nm thick single-crystal Si layer (SOI layer) 11c on the oxide film 12a was obtained. When the thickness of the resultant SOI substrate 40 was measured at 100 points in the entire plane, the film thickness uniformity of the SOI layer 11c was 200 nm±4 nm. The oxide film (BOX; buried oxide film) 12a had a uniform thickness of 20 nm±1 nm.

EXAMPLE 3

A 300-nm thick $SiO_2$ film (insulating layer) 12 was formed on a first single-crystal Si substrate (seed substrate) 11 by thermal oxidation ("a" of FIG. 1). $H^+$ ions were implanted through the $SiO_2$ film 12 on the surface of the first substrate at 30 KeV and $8 \times 10^{16}$ $cm^{-2}$ to form an ion-implanted layer 13 ("b" of FIG. 1). The 300-nm thick $SiO_2$ film 12 on the first substrate was etched by 295 nm by using a buffered hydrofluoric acid solution to convert the $SiO_2$ film 12 into a 5-nm thick $SiO_2$ film 12a ("c" of FIG. 1). The surface of the $SiO_2$ layer 12a was placed on the surface of a separately prepared Si substrate (second substrate (handle wafer)) 20 to form a bonded substrate stack 30 ("d" of FIG. 1).

The bonded substrate stack 30 was annealed at 450° C. The bonded substrate stack 30 was split into two parts near the projection range of ion implantation (ion-implanted layer 13). An SOI substrate having, on the second substrate 20, the 5-nm thick $SiO_2$ film 12a and a 100-nm thick single-crystal film 11b having a rough surface and formed on the $SiO_2$ film 12a was obtained ("e" of FIG. 1). To increase the bonding strength of the SOI substrate, annealing was executed at 900° C. for 2 hrs.

To planarize the surface of the SOI substrate and obtain the SOI layer 11b having a desired thickness, the surface of the SOI layer 11b was ground and polished by 50 nm by CMP ("f" of FIG. 1). In addition, to remove damage on the surface of the SOI layer 11b, which was introduced by CMP, and planarize the surface of the SOI layer 11b, annealing was executed in a hydrogen atmosphere at 1,050° C. for 2 hrs. The surface roughness of the SOI layer 11c after annealing was evaluated by using an atomic force microscope. The mean square roughness in a region with a size of 50 μm square was about 0.2 nm, which was the same as that of a normally commercially available Si wafer.

With the above steps, an SOI substrate 40 having the 5-nm thick oxide film 12a on the Si substrate 20 and a 50-nm thick single-crystal Si layer (SOI layer) 11c on the oxide film 12a was obtained. When the thickness of the resultant SOI substrate 40 was measured at 100 points in the entire plane, the film thickness uniformity of the SOI layer 11c was 50 nm±2 nm. The oxide film (BOX; buried oxide film) 12a had a uniform thickness of 5 nm±1 nm.

The first substrate 11a after splitting could be used as the first substrate 11 or second substrate 20 again by annealing an ion-implanted layer 13b remaining on the surface in a hydrogen atmosphere or executing a surface treatment such as surface polishing ("g" of FIG. 1).

EXAMPLE 4

A first substrate 11 was formed by epitaxially growing a 1.5-μm thick single-crystal Si layer on a single-crystal Si substrate by CVD (Chemical Vapor Deposition). The growth conditions were as follows.

| | |
|---|---|
| Source gas: | $SiH_2Cl_2/H_2$ |
| Gas flow rate: | 0.5/180 liters/min |
| Gas pressure: | 80 Torr |
| Temperature: | 950° C. |
| Growth rate: | 0.30 μm/min |

A 200-nm thick $SiO_2$ film 12 was formed on the first substrate 11 by thermal oxidation ("a" of FIG. 1). $H^+$ ions were implanted through the $SiO_2$ film 12 on the surface of the first substrate at 30 KeV and $1 \times 10^{17}$ $cm^{-2}$ to form an ion-implanted layer 13 ("b" of FIG. 1). The 200-nm thick $SiO_2$ film 12 on the first substrate was etched by 170 nm by using a buffered hydrofluoric acid solution to convert the $SiO_2$ film 12 into a 30-nm thick $SiO_2$ film 12a ("c" of FIG. 1). The surface of the $SiO_2$ layer 12a was placed on the surface of a separately prepared Si substrate (second substrate (handle wafer)) 20 to form a bonded substrate stack 30 ("d" of FIG. 1).

The bonded substrate stack 30 was annealed at 500° C. The bonded substrate stack 30 was split into two parts near the projection range of ion implantation (ion-implanted layer 13). An SOI substrate having, on the second substrate 20, the 30-nm thick $SiO_2$ film 12a and a 200-nm thick single-crystal film 11b having a rough surface and formed on the $SiO_2$ film 12a was obtained ("e" of FIG. 1). To increase the bonding strength of the SOI substrate, annealing was executed at 1,000° C. for 1 hr. To planarize the surface of the SOI substrate and obtain the SOI layer 11b having a desired thickness, the single-crystal Si layer 11b on the surface was ground and polished by 170 nm by CMP ("f" of FIG. 1). In addition, to remove damage on the surface of the SOI layer 11b, which was introduced by CMP, and planarize the surface of the SOI layer 11b, annealing was executed in a hydrogen atmosphere at 1,000° C. for 2 hrs. The surface roughness of the SOI layer 11c after annealing was evaluated by using an atomic force microscope. The mean square roughness in a region with a size of 50 μm square was about 0.2 nm, which was the same as that of a normally commercially available Si wafer.

With the above steps, an SOI substrate 40 having the 30-nm thick oxide film 12a on the Si substrate 20 and a 30-nm thick single-crystal Si layer (SOI layer) 11c on the oxide film 12a was obtained.

The resultant SOI substrate 40 was dipped in a concentrated HF solution for 15 min, and then, the entire surface of the substrate was confirmed by using an optical microscope. The number of holes formed by HF in buried oxide film (BOX) 12a was very small, and only one hole was confirmed. That is, when the first substrate 11 having an epitaxial silicon layer on its surface was used, an SOI substrate free from COP could be obtained, which had a higher-quality SOI layer than an SOI substrate manufactured by using a conventional CZ substrate in an HF defect test.

When the thickness of the resultant SOI substrate 40 was measured at 100 points in the entire plane, the film thickness uniformity of an SOI (Si single-crystal) film 11c was 30 nm±1.5 nm. The oxide film (BOX; buried oxide film) 12a had a uniform thickness of 30 nm± 1 nm.

The first substrate 11a after splitting could be used as the first substrate 11 or second substrate 20 again by annealing an ion-implanted layer 13b remaining on the surface in a hydrogen atmosphere or executing a surface treatment such as surface polishing ("g" of FIG. 1). When the first substrate 11a after splitting should be used again as the first substrate 11, the decreased wafer thickness was compensated for by an epitaxial layer 11d. In this case, the substrate could be reused semipermanently. More specifically, when, from the second cycle of manufacturing, the epitaxial layer 11d is formed to a thickness that can compensate for the thickness (the decreased wafer thickness) consumed in the step from formation of the insulating layer 12 to splitting, the first substrate can be used semipermanently. In this case, the ion-implanted layer 13 is formed in the epitaxial layer.

EXAMPLE 5

A first substrate 111 was formed by epitaxially growing a 3-μm thick single-crystal Si layer 111f on a single-crystal Si substrate 111a by CVD (Chemical Vapor Deposition). The growth conditions were as follows.

| | |
|---|---|
| Source gas: | $SiH_2Cl_2/H_2$ |
| Gas flow rate: | 0.5/180 liters/min |
| Gas pressure: | 80 Torr |
| Temperature: | 950° C. |
| Growth rate: | 0.30 μm/min |

A 200-nm thick $SiO_2$ film 112 was formed on the first substrate 111 by thermal oxidation ("a" of FIG. 2). $H^+$ ions were implanted through the $SiO_2$ film 112 on the surface of the first substrate at 30 KeV and $1 \times 10^{17}$ $cm^{-2}$ to form an ion-implanted layer 113 ("b" of FIG. 2). The 200-nm thick $SiO_2$ film 112 on the first substrate was etched by 170 nm by using a buffered hydrofluoric acid solution to convert the $SiO_2$ film 112 into a 30-nm thick $SiO_2$ film 112a ("c" of FIG. 2). The surface of the $SiO_2$ layer 112a was placed on the surface of the separately prepared Si substrate (second substrate (handle wafer)) 120 to form a bonded substrate stack 130 ("d" of FIG. 2).

The bonded substrate stack 130 was annealed at 500° C. The bonded substrate stack 130 was split into two parts near the projection range of ion implantation (ion-implanted layer 113). An SOI substrate having, on a second substrate 120, the 30-nm thick $SiO_2$ film 112a and a 200-nm thick single-crystal film 111b having a rough surface and formed on the $SiO_2$ film 112a was obtained ("e" of FIG. 2). To increase the bonding strength of the SOI substrate, annealing was executed at 1,000° C. for 1 hr. To planarize the surface of the SOI substrate and obtain the SOI layer 111b having a desired thickness, the single-crystal Si layer 111b on the surface was ground and polished by 170 nm by CMP ("f" of FIG. 2). In addition, to remove damage on the surface of the SOI layer 111b, which was introduced by CMP, and planarize the surface of the SOI layer 111b, annealing was executed in a hydrogen atmosphere at 1,000° C. for 2 hrs. The surface roughness of an SOI layer 111d after annealing was evaluated by using an atomic force microscope. The mean square roughness in a region with a size of 50 μm square was about 0.2 nm, which was the same as that of a normally commercially available Si wafer.

With the above steps, an SOI substrate 140 having the 30-nm thick oxide film 112a on the Si substrate 120 and the 30-nm thick single-crystal Si layer (SOI layer) 111d on the oxide film 112a was obtained.

The resultant SOI substrate 140 was dipped in a concentrated HF solution for 15 min, and then, the entire surface of the substrate was confirmed by using an optical microscope. The number of holes formed by HF in buried oxide film (BOX) 112*a* was very small, and only one hole was confirmed. That is, when the first substrate 111 having the epitaxial silicon layer 111*f* on its surface was used, an SOI substrate free from COP could be obtained, which had a higher-quality SOI layer than an SOI substrate manufactured by using a conventional CZ substrate in an HF defect test.

When the thickness of the resultant SOI substrate 140 was measured at 100 points in the entire plane, the film thickness uniformity of the SOI (Si single-crystal) film 111*d* was 30 nm±1.5 nm. The oxide film (BOX; buried oxide film) 112*a* had a uniform thickness of 30 nm±1 nm.

A first substrate 111' after splitting was used as the first substrate 111 again by annealing an ion-implanted layer 113*b* remaining on the surface in a hydrogen atmosphere or executing a surface treatment such as surface polishing ("g" of FIG. 2). When the cycle including the series of steps was executed nine times, the thickness of the epitaxial layer 111*f* that was grown on the first single-crystal Si substrate 111*a* in advance decreased from 3 $\mu$m to 0.2 $\mu$m. When the epitaxial layer 111*e* was formed on the first substrate 111' to compensate for the decreased thickness of the epitaxial layer, the first substrate could be used again.

According to the present invention, for example, a substrate having a thin buried insulating film can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing a substrate having a buried insulating layer, comprising
    an insulating layer formation step of forming an insulating layer on a semiconductor region of a first substrate including the semiconductor region;
    an implantation step of implanting ions into the semiconductor region through the insulating layer to form an ion-implanted layer;
    an insulating layer thinning step of thinning down the insulating layer by chemical etching after the implantation step;
    a bonding step of bonding a second substrate to the first substrate via the insulating layer to prepare a bonded substrate stack after the insulating layer thinning step; and
    a splitting step of splitting the bonded substrate stack by using the ion-implanted layer to obtain a substrate which has the insulating layer on the second substrate and a semiconductor layer as part of the semiconductor region on the insulating layer.

2. The method according to claim 1, further comprising a removal step of removing the ion-implanted layer that remains on a surface of the second substrate after splitting.

3. The method according to claim 2, wherein the removal step includes a step of etching the surface of the second substrate after splitting.

4. The method according to claim 2, wherein the removal step includes a step of polishing the surface of the second substrate after splitting.

5. The method according to claim 1, further comprising a semiconductor layer thinning step of thinning down the semiconductor layer on the second substrate after splitting.

6. The method according to claim 5, wherein the semiconductor layer thinning step includes a step of etching the semiconductor layer.

7. The method according to claim 5, wherein the semiconductor layer thinning step includes a step of polishing the semiconductor layer.

8. The method according to claim 1, wherein in the insulating layer formation step, the insulating layer is formed on the first substrate having an epitaxial layer on a surface.

\* \* \* \* \*

UNITED STATES PATENT AND TRADEMARK OFFICE
CERTIFICATE OF CORRECTION

PATENT NO.       : 7,008,860 B2                                           Page 1 of 1
APPLICATION NO.  : 10/778248
DATED            : March 7, 2006
INVENTOR(S)      : Yasuo Kakizaki et al.

It is certified that error appears in the above-identified patent and that said Letters Patent is hereby corrected as shown below:

COLUMN 11

Line 37, "comprising" should read --comprising:--.

Signed and Sealed this

Twenty-second Day of August, 2006

JON W. DUDAS
*Director of the United States Patent and Trademark Office*